US010177103B1

(12) United States Patent
Yi et al.

(10) Patent No.: US 10,177,103 B1
(45) Date of Patent: Jan. 8, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Moon Hee Yi, Suwon-si (KR); Yong Ho Baek, Suwon-si (KR); Tae Seong Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/807,075

(22) Filed: Nov. 8, 2017

(30) Foreign Application Priority Data

Jul. 4, 2017 (KR) .......................... 10-2017-0084713

(51) Int. Cl.
H01L 23/00 (2006.01)
(52) U.S. Cl.
CPC .............. *H01L 24/02* (2013.01); *H01L 24/20* (2013.01); *H01L 24/24* (2013.01); *H01L 24/25* (2013.01); *H01L 24/73* (2013.01); *H01L 2224/024* (2013.01); *H01L 2224/02319* (2013.01); *H01L 2224/02331* (2013.01); *H01L 2224/02371* (2013.01); *H01L 2224/02373* (2013.01); *H01L 2224/02375* (2013.01); *H01L 2224/02379* (2013.01); *H01L 2224/02381* (2013.01); *H01L 2224/2101* (2013.01); *H01L 2224/215* (2013.01); *H01L 2224/24195* (2013.01); *H01L 2224/25105* (2013.01); *H01L 2224/25171* (2013.01); *H01L 2224/73259* (2013.01)

(58) Field of Classification Search
CPC ................. H01L 23/5389; H01L 24/20; H01L 2224/02379; H01L 23/5386; H01L 2924/19105; H01L 2924/3025
See application file for complete search history.

(56) References Cited

U.S. PATENT DOCUMENTS

| 7,445,957 | B2 | 11/2008 | Huang et al. | |
|---|---|---|---|---|
| 7,911,044 | B2 | 3/2011 | Yang et al. | |
| 9,859,267 | B2 * | 1/2018 | Hou | H01L 23/528 |
| 2008/0237828 | A1 * | 10/2008 | Yang | H01L 21/6835 |
| | | | | 257/690 |
| 2011/0304999 | A1 * | 12/2011 | Yu | H01L 23/15 |
| | | | | 361/783 |
| 2012/0228754 | A1 * | 9/2012 | Liu | H01L 23/13 |
| | | | | 257/676 |
| 2017/0148778 | A1 * | 5/2017 | Hou | H01L 23/5389 |

* cited by examiner

Primary Examiner — Jaehwan Oh
(74) Attorney, Agent, or Firm — McDermott Will & Emery LLP

(57) ABSTRACT

A fan-out semiconductor package includes: a support member having a through-hole; a semiconductor chip disposed in the through-hole and having an active surface having connection pads disposed thereon and an inactive surface opposing the active surface; an encapsulant encapsulating at least portions of the support member and the semiconductor chip; and a connection member disposed on the support member and the active surface of the semiconductor chip and including a redistribution layer electrically connected to the connection pads. The support member includes a glass plate and an insulating layer connected to the glass plate.

17 Claims, 13 Drawing Sheets

I-I'

II-II'

III-III'

FAN-OUT SEMICONDUCTOR PACKAGE

CROSS-REFERENCE TO RELATED APPLICATION(S)

This application claims benefit of priority to Korean Patent Application No. 10-2017-0084713 filed on Jul. 4, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

A significant recent trend in the development of technology related to semiconductor chips has been to reduce the size of semiconductor chips. Therefore, in the field of package technology, in accordance with a rapid increase in demand for miniaturized semiconductor chips, or the like, the implementation of a semiconductor package having a compact size while including a plurality of pins has been demanded.

One type of semiconductor package technology suggested to satisfy the technical demand as described above is a fan-out semiconductor package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a warpage problem may be suppressed due to excellent rigidity, in spite of having a reduced thickness.

According to an aspect of the present disclosure, a fan-out semiconductor package may be provided, in which a support member capable of improving rigidity of the fan-out semiconductor package and including a mixed layer of a glass plate and an insulating layer is used in a region in which a semiconductor chip is disposed.

According to an aspect of the present disclosure, a fan-out semiconductor package may include: a support member having a through-hole; a semiconductor chip disposed in the through-hole and having an active surface having connection pads disposed thereon and an inactive surface opposing the active surface; an encapsulant encapsulating at least portions of the support member and the semiconductor chip; and a connection member disposed on the support member and the active surface of the semiconductor chip and including a redistribution layer electrically connected to the connection pads. The support member includes a glass plate and an insulating layer connected to the glass plate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
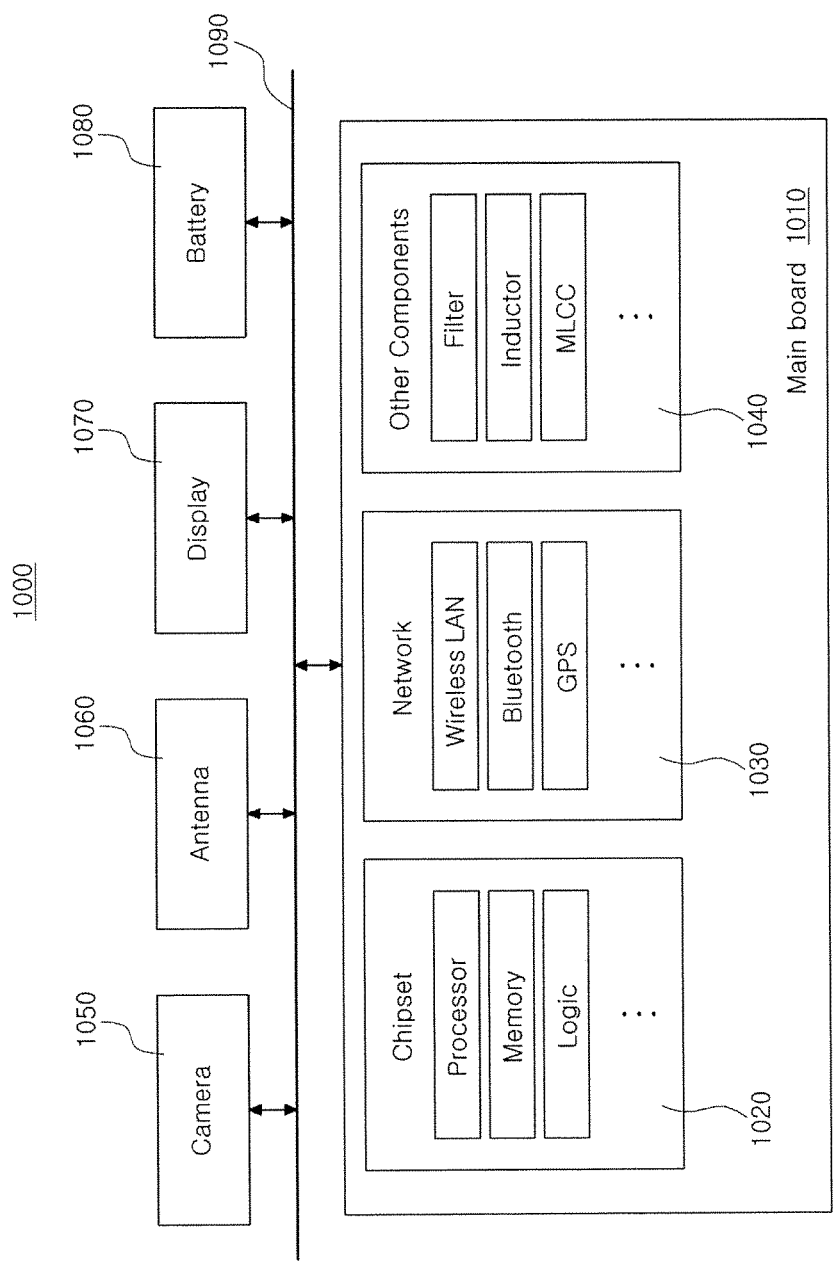
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
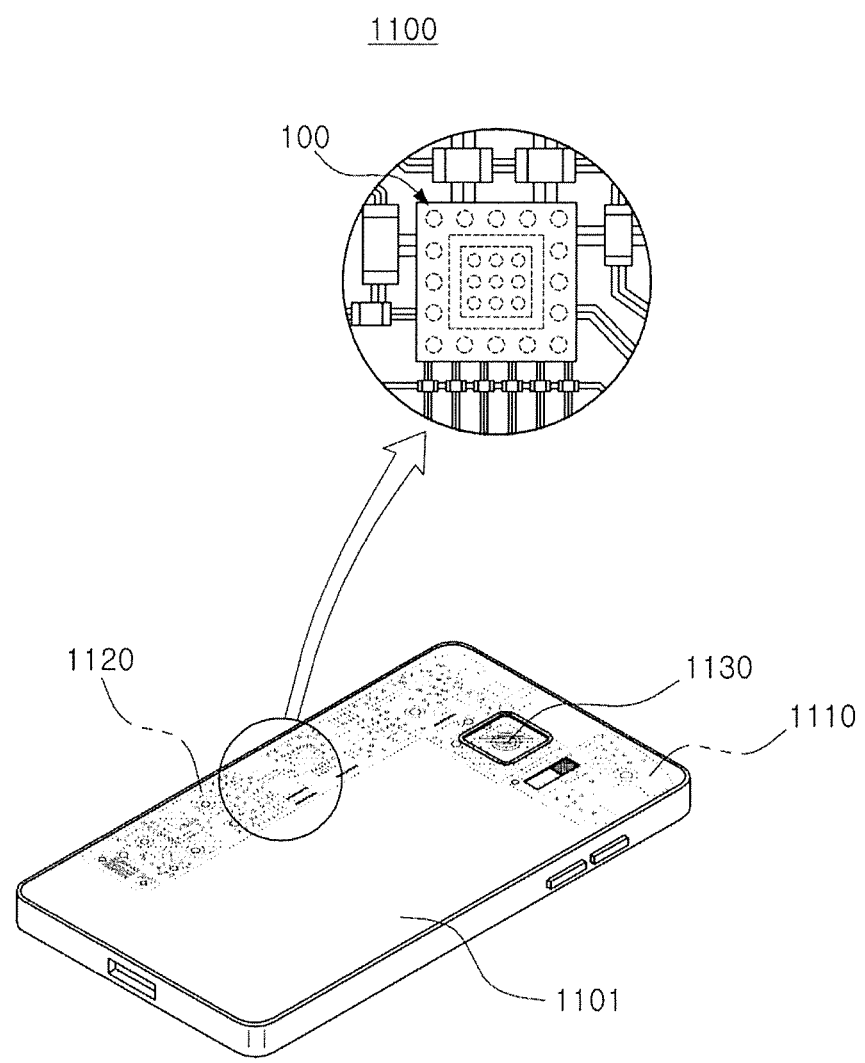
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mother board 1110 may be accommodated in a body 1101 of a smartphone 1100, and various electronic components 1120 may be physically or electrically connected to the mother board 1110. In addition, other components that may or may not be physically or electrically connected to the mother board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

(Fan-in Semiconductor Package)

Figure 3B:
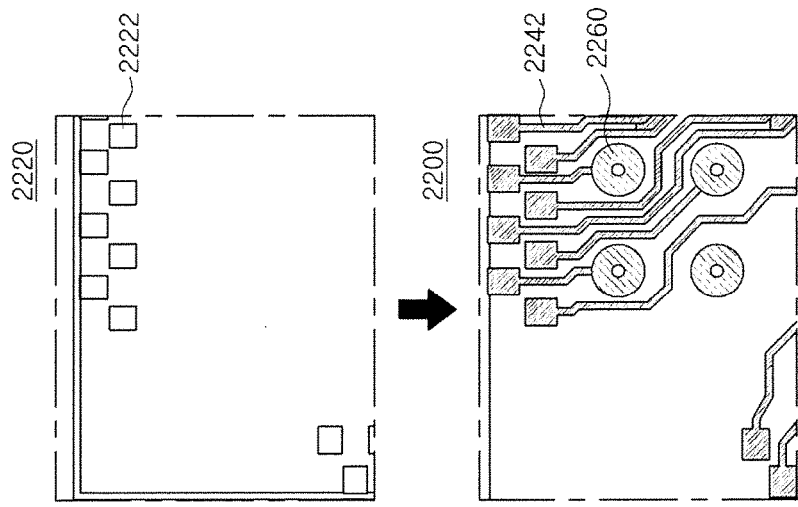
FIGS. 3A and 3B are schematic cross-sectional views illustrating states of a fan-in semiconductor package before and after being packaged.
Figure 3A:
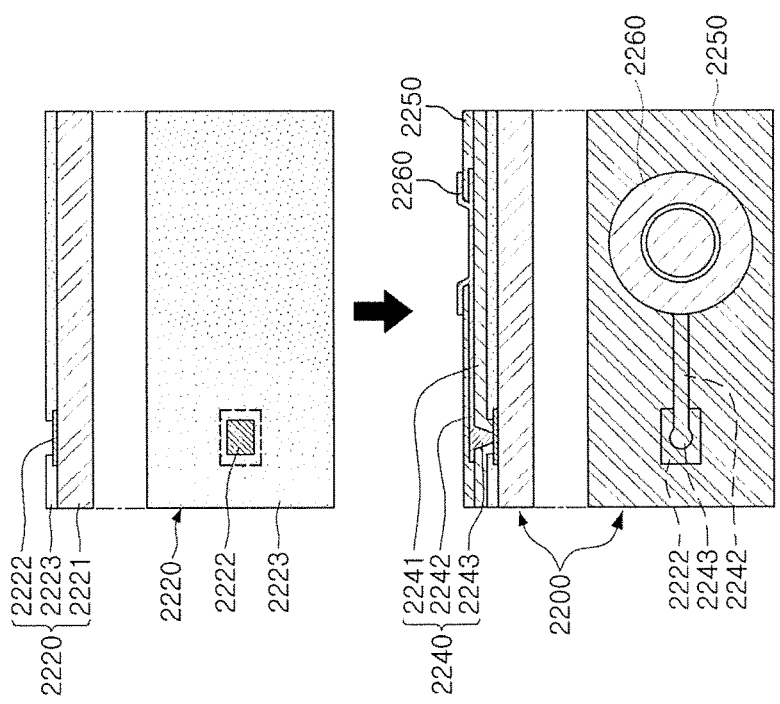

FIGS. 3A and 3B are schematic cross-sectional views illustrating states of a fan-in semiconductor package before and after being packaged.

Figure 4:
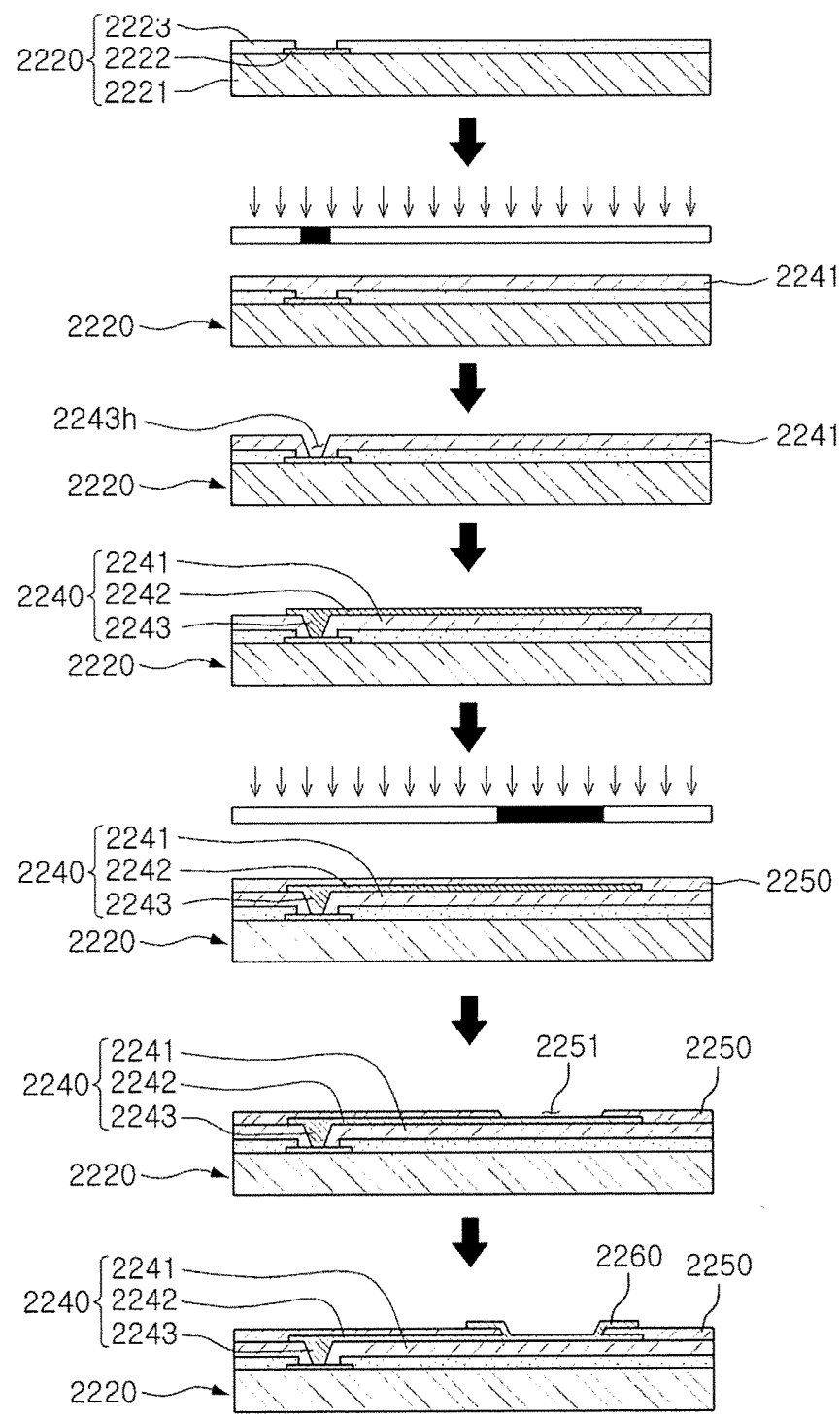
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
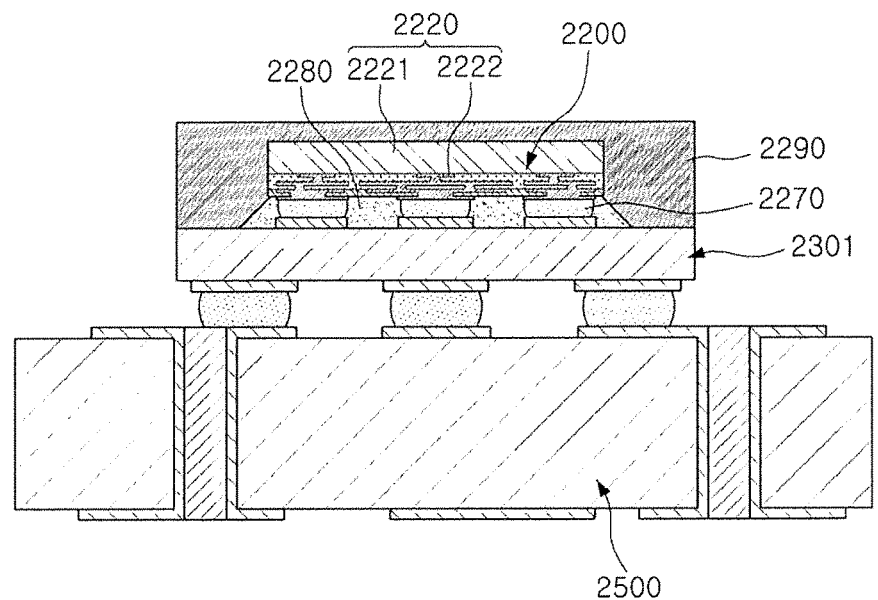
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
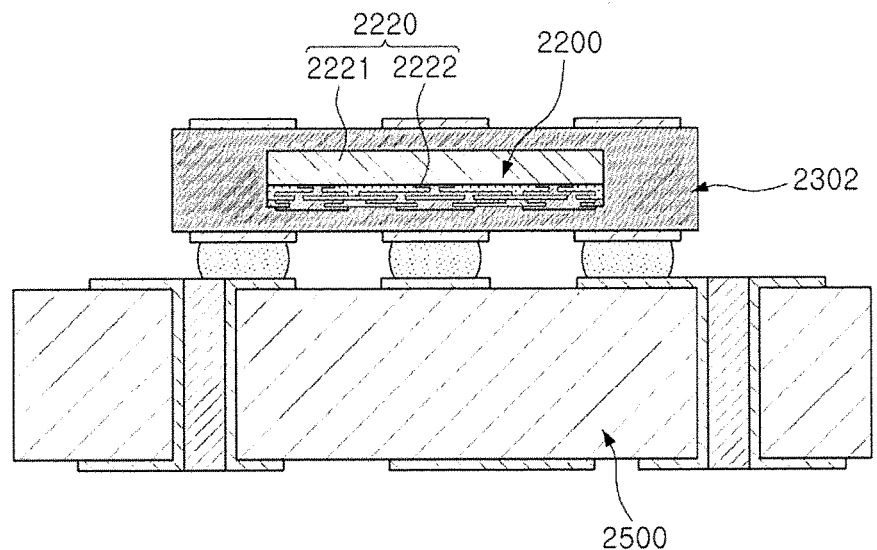
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

(Fan-Out Semiconductor Package)

Figure 7:
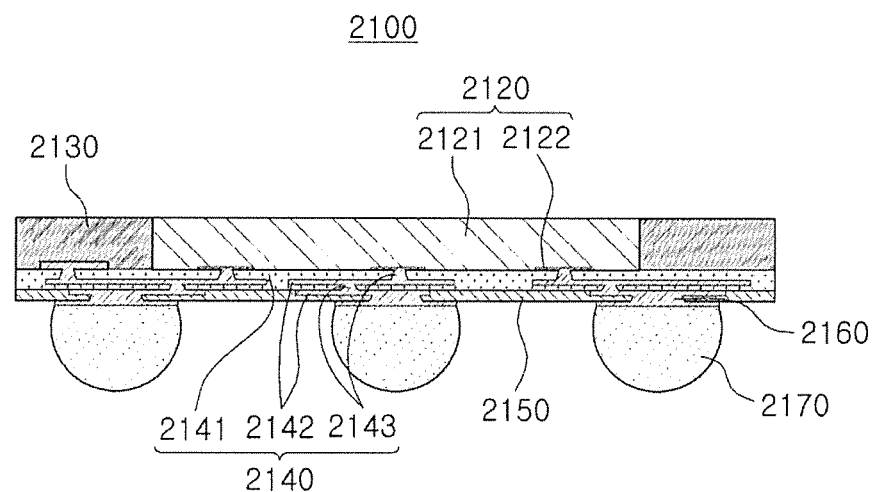
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
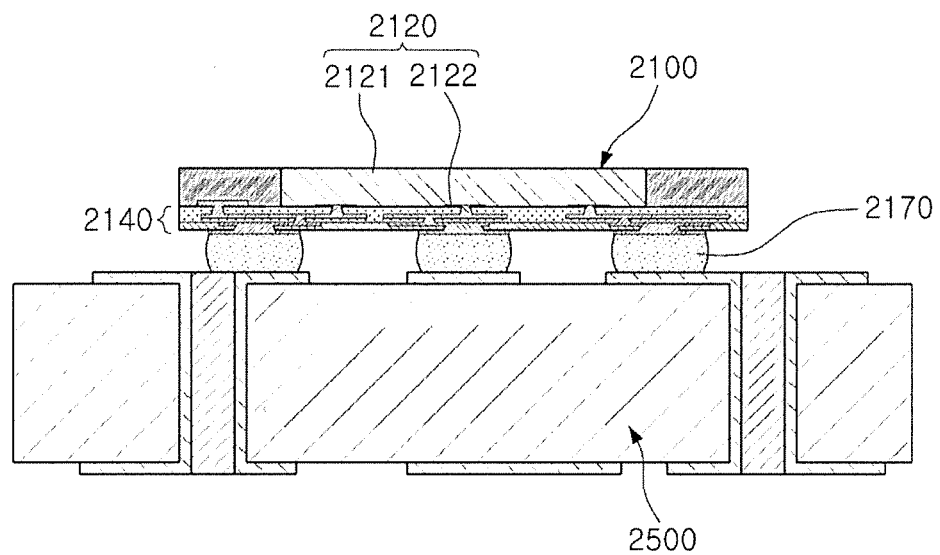
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package having excellent rigidity according to the present disclosure will hereinafter be described with reference to the drawings.

Figure 9:
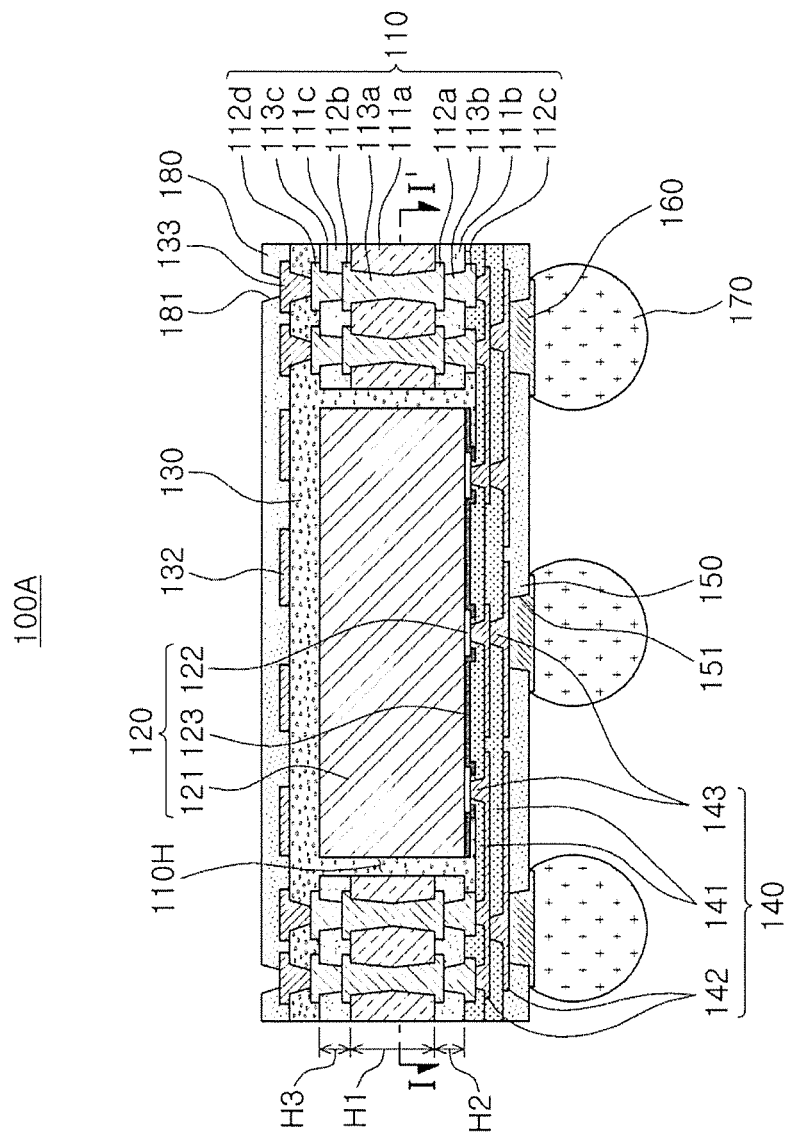
FIG. 9 is a schematic cross-sectional view illustrating an example of a fan-out semiconductor package.

FIG. 9 is a schematic cross-sectional view illustrating an example of a fan-out semiconductor package.

Figure 10:
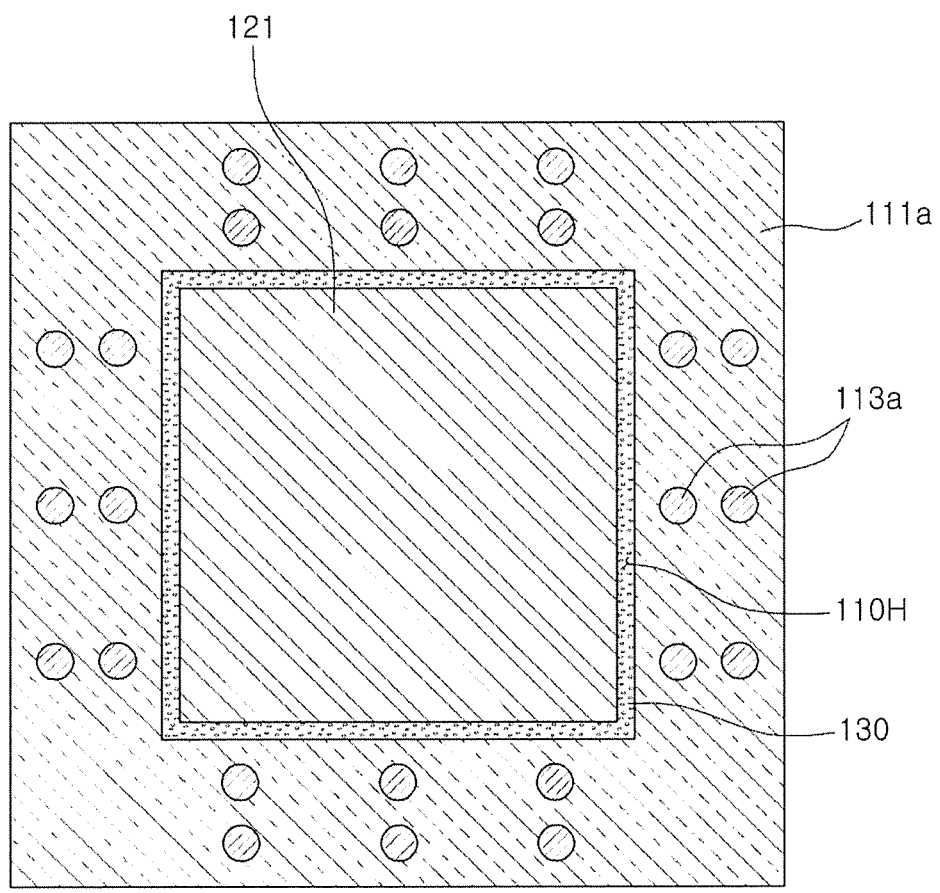
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a support member 110 having a through-hole 110H, a semiconductor chip 120 disposed in the through-hole 110H and having an active surface having connection pads 122 disposed thereon and an inactive surface opposing the active surface, an encapsulant 130 encapsulating at least portions of the support member 110 and the semiconductor chip 120, and a connection member 140 disposed on the support member 110 and the active surface of the semiconductor chip 120. The support member 110 may include a glass plate 111a and insulating layers 111b and 111c disposed on the glass plate 111a. The support member 110 may include redistribution layers 112a, 112b, 112c, and 112d electrically connected to the connection pads 122, and include vias 113a, 113b, and 113c for electrical connection between the connection pads 122 and the redistribution layers 112a, 112b, 112c, and 112d. The connection member 140 may also include redistribution layers 142 electrically connected to the connection pads 122.

Meanwhile, recently, it has become important to reduce a thickness of a set used in mobile products such as smartphones, tablet personal computers (PCs), and the like, in accordance with a trend toward improvement and diversification of performance of the set and slimness of the mobile products. Therefore, components constituting the set have also become thin. A semiconductor package has also become thin. However, as the semiconductor package becomes thin, rigidity of the semiconductor package becomes weak, such that a warpage problem of the semiconductor package occurs. Therefore, a demand for a semiconductor package that may maintain rigidity in spite of being thin has increased. As a method of solving the problem described above, technology of using a material having excellent rigidity, including a glass fabric (or a glass fiber or a glass cloth) such as prepreg (PPG) in a region in which a semiconductor chip is disposed has been developed. However, a thickness of the material needs to be significantly great in order to give sufficient rigidity. Meanwhile, it may be considered to introduce a glass substrate, which is an amorphous solid material including a glass component instead of the prepreg, into the region in which the semiconductor chip is disposed, as an alternative. However, the glass substrate may be broken due to various causes when it is singly used.

On the other hand, in the fan-out semiconductor package 100A according to the exemplary embodiment, the support member 110 may be disposed in a region in which the semiconductor chip 120 is disposed, and the support member 110 may include the glass plate 111a to thus have excellent rigidity in spite of having a reduced thickness. Further, the support member 110 may include the insulating layers 111b and 111c connected to the glass plate 111a together with the glass plate 111a, and the insulating layers 111b and 111c may hold the glass plate 111a to efficiently prevent the glass plate 111a from being broken. In addition, the redistribution layers 112a, 112b, 112c, and 112d may be introduced as multiple layers into the support member 110 due to introduction of a mixed layer of the glass plate 111a and the insulating layers 111b and 111c to thus further thin the connection member 140. In addition, the vias 113a, 113b, and 113c may be formed in the glass plate 111a and the insulating layers 111b and 111c to provide an electrical path to the support member 110. Therefore, the fan-out semiconductor package 100A may be used in a package-on-package (PoP), or the like.

The respective components included in the fan-out semiconductor package 100A according to the exemplary embodiment will hereinafter be described in more detail.

The support member 110 may include the glass plate 111a to thus have excellent rigidity in spite of a reduced thickness. The support member 110 may include the insulating layers 111b and 111c to prevent the glass plate 111a from being broken, and the redistribution layers 112a, 112b, 112c, and 112d may be introduced as the multiple layers into the support member 110. The support member 110 may include the redistribution layers 112a, 112b, 112c, and 112d redistributing the connection pads 122 of the semiconductor chip 120 to thus improve a degree of freedom in a design of the connection member 140. Since the support member 110 includes the vias 113a, 113b, and 113c penetrating through the glass plate 111a and the insulating layers 111b and 111c, the fan-out semiconductor package 100A according to the exemplary embodiment may be utilized as a PoP type package. The support member 110 may have the through-hole 110H penetrating through both of the glass plate 111a and the insulating layers 111b and 111c. The semiconductor chip 120 may be disposed in the through-hole 110H to be spaced apart from the support member 110 by a predetermined distance. Side surfaces of the semiconductor chip 120 may be surrounded by the support member 110. However, such a form is only an example and may be variously modified to have other forms, and the support member 110 may perform another function depending on such a form.

The support member 110 may include the glass plate 111a, a first redistribution layer 112a disposed on a lower surface of the glass plate 111a, a second redistribution layer 112b disposed on an upper surface of the glass plate 111a, a first insulating layer 111b disposed on the lower surface of the glass plate 111a and covering the first redistribution layer 112a, a third redistribution layer 112c disposed on a lower surface of the first insulating layer 111b, a second insulating layer 111c disposed on the upper surface of the glass plate 111a and covering the second redistribution layer 112b, and a fourth redistribution layer 112d disposed on an upper surface of the second insulating layer 111c. In addition, the support member 110 may include a first via 113a penetrating through the glass plate 111a and electrically connecting the first and second redistribution layers 112a and 112b to each other, a second via 113b penetrating through the first insulating layer 111b and electrically connecting the first and third redistribution layers 112a and 112c to each other, and a third via 113c penetrating through the second insulating layer 111c and electrically connecting the second and fourth redistribution layers 112b and 112d to each other. Meanwhile, the support member 110 may include only the glass plate 111a and the insulating layers 111b and 111c, if necessary. That is, the redistribution layers 112a, 112b, 112c, and 112d and the vias 113a, 113b, and 113c may be omitted, if necessary.

The glass plate 111a refers to an amorphous solid material including a glass component. That is, glass of the glass plate 111a, which refers to a material having high transparency, generated when silica, a sodium carbonate, a calcium carbonate, or the like, is dissolved at a high temperature and is then cooled, may be a concept different from that of an insulating material having a glass fiber or an inorganic filler included in an insulating resin. The glass of the glass plate 111a may be silicate glass such as soda lime glass, potassium lime glass, lead glass, barium glass, silicate glass, or the like, borosilicate glass such as Pyrex, alumina glass, or the like, or phosphate glass, but is not limited thereto. For example, the glass of the glass plate 111a may include a silicate component. Silicate may be formed of a combination of silica ($SiO_2$) and a metal oxide such as a boron oxide, a sodium oxide, an aluminum oxide, a barium oxide, a lithium oxide, a calcium oxide, a zirconium oxide, or the like. As an example, the glass plate 111a may include a silicate component in which one or more selected from the group consisting of a boron oxide ($B_2O_3$), a sodium oxide ($Na_2O$), an aluminum oxide ($Al_2O_3$), a barium oxide (BaO), a lithium oxide ($Li_2O$), a calcium oxide (CaO), a zirconium oxide ($ZrO_2$) and silica ($SiO_2$) are combined with each other, but is not limited thereto.

A material of each of the insulating layers 111b and 111c is not particularly limited. For example, an insulating material may be used as the material of each of the insulating layers 111b and 111c. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, Ajinomoto build-up film (ABF), FR-4, Bismaleimide Triazine (BT), or the like. Alternatively, a PID resin may also be used as the insulating material.

A thickness $H_1$ of the glass plate 111a may be greater than thicknesses $H_2$ and $H_3$ of the insulating layers 111b and 111c. That is, the glass plate 111a may be introduced in order to substantially give rigidity to thus have a significant thickness, but the insulating layers 111b and 111c may be introduced in order to prevent the glass plate 111a from being broken to thus have a relatively reduced thickness.

The redistribution layers 112a, 112b, 112c, and 112d may serve to redistribute the connection pads 122 of the semiconductor chip 120. A material of each of the redistribution layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, 112c, and 112d may perform various functions depending on designs of their corresponding layers. For example, the redistribution layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, 112c, and 112d may include via pads, wire pads, connection terminal pads, and the like.

Thicknesses of the redistribution layers 112a, 112b, 112c, and 112d of the support member 110 may be greater than those of the redistribution layers 142 of the connection member 140. Since the support member 110 may have a thickness equal to or greater than that of the semiconductor chip 120, the redistribution layers 112a, 112b, 112c, and 112d may be formed at large sizes depending on a scale of the support member 110. On the other hand, the redistribution layers 142 of the connection member 140 may be formed at sizes relatively smaller than those of the redistribution layers 112a, 112b, 112c, and 112d for thinness.

The vias 113a, 113b, and 113c may electrically connect the redistribution layers 112a, 112b, 112c, and 112d formed on different layers to each other, resulting in an electrical path in the support member 110. A material of each of the vias 113a, 113b, and 113c may be a conductive material such as copper (Cu), aluminum (Al), silver (Ag), tin (Sn), gold (Au), nickel (Ni), lead (Pb), titanium (Ti), or alloys thereof, like that of each of the redistribution layers 112a, 112b, 112c, and 112d. Each of the vias 113a, 113b, and 113c may be completely filled with the conductive material, or the conductive material may also be formed along a wall of each of via holes.

The vias 113a, 113b, and 113c may have different cross-sectional shapes. Here, the cross-sectional shape refers to a shape illustrated through a cross-sectional view. For example, the first via 113a may have a cylindrical shape or a sandglass shape, the second via 113b may have a reverse tapered shape, and the third via 113c may have a tapered shape. However, the first to third vias 113 to 113c are not limited thereto.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a microcontroller, or the like, but is not limited thereto. For example, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be an IC formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. If necessary, a redistribution layer (not illustrated) may be further formed on the active surface of the semiconductor chip 120, and bumps (not illustrated), or the like, may be connected to the connection pads 122.

The encapsulant 130 may protect the support member 110, the semiconductor chip 120, and the like. An encapsulation form of the encapsulant 130 is not particularly limited, but may be a form in which the encapsulant 130 surrounds at least portions of the support member 110, the semiconductor chip 120, and the like. For example, the encapsulant 130 may cover the support member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, a thermosetting resin such as an epoxy resin, a thermoplastic resin such as a polyimide resin, a resin in which the thermosetting resin and the thermoplastic resin are mixed with an inorganic filler, for example, ABF, or the like, may be used as the insulating material. However, the material of the encapsulant 130 is not limited thereto, but may also be prepreg, or the like, including a glass fiber.

A backside redistribution layer 132 may be disposed on the encapsulant 130, and may be electrically connected to the redistribution layer 112d of the support member 110 through backside vias 133 penetrating through the encapsulant 130. The backside redistribution layer 132 may also include a conductive material such as copper (Cu), aluminum (Al), silver (Ag), tin (Sn), gold (Au), nickel (Ni), lead (Pb), titanium (Ti), or alloys thereof. The backside redistribution layer 132 may also be used as redistribution patterns, and may include, for example, ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the backside redistribution layer 132 may include via pads, connection terminal pads, and the like. The backside redistribution layer 132 may be omitted, if necessary.

The backside vias 133 may electrically connect the backside redistribution layer 132 to the redistribution layer 112d of the support member 110. A material of each of the backside vias 133 may be a conductive material such as copper (Cu), aluminum (Al), silver (Ag), tin (Sn), gold (Au), nickel (Ni), lead (Pb), titanium (Ti), or alloys thereof. Each of the backside vias 133 may be completely filled with the conductive material, or the conductive material may also be formed along a wall of each of the vias. In addition, each of the backside vias 133 may have all of the shapes known in the related art such as a tapered shape.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically connected to an external source through connection terminals 170 depending on the functions. The connection member 140 may include insulating layers 141 disposed on the support member 110 and the active surface of the semiconductor chip 120, the redistribution layers 142 disposed on the insulating layers 141, and vias 143 electrically connecting the redistribution layers 142 and the connection pads 142 or the redistribution layers 142 disposed on different layers to each other. The connection member 140 may include a larger number of layers or a smaller number of layers depending on a design.

A material of each of the insulating layers 141 may be an insulating material. In this case, a photosensitive insulating material such as a PID resin may also be used as the insulating material. That is, each of the insulating layers 141 may be a photosensitive insulating layer. When the insulating layer 141 has photosensitive properties, the insulating layer 141 may be formed to have a smaller thickness, and a fine pitch of the via 143 may be achieved more easily. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 142 may include via pads, connection terminal pads, and the like.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art such as a reverse tapered shape.

A first passivation layer 150 may protect the connection member 140 from external physical or chemical damage. The first passivation layer 150 may have openings 151 exposing at least portions of the redistribution layer 142 of the connection member 140. The number of openings 151 formed in the first passivation layer 150 may be several tens to several thousands. A material of the first passivation layer 150 is not particularly limited. For example, an insulating material may be used as the material of the first passivation layer 150. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, ABF, FR-4, BT, or the like. Alternatively, a solder resist may also be used.

An underbump metal layer 160 may improve connection reliability of the connection terminals 170 to improve board level reliability of the fan-out semiconductor package 100A. The underbump metal layer 160 may be connected to the redistribution layer 142 of the connection member 140 exposed through the openings 151 of the first passivation layer 150. The underbump metal layer 160 may be formed in the openings 151 of the first passivation layer 150 by the known metallization method using the known conductive metal such as a metal, but is not limited thereto.

The connection terminals 170 may physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, but may be sufficiently modified by a person skilled in the art depending on design particulars. For example, the connection terminals 170 may be provided in an amount of several tens to several thousands according to the number of connection pads 122, or may be provided in an amount of several tens to several thousands or more or several tens to several thousands or less. When the connection terminals 170 are solder balls, the connection terminals 170 may cover side surfaces of the underbump metal layer 160 extending onto one surface of the first passivation layer 150, and connection reliability may be more excellent.

At least one of the connection terminals 170 may be disposed in a fan-out region. The fan-out region is a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have price competitiveness.

A second passivation layer 180 may protect the backside redistribution layer 132 from external physical or chemical damage. The second passivation layer 180 may have openings 181 exposing at least portions of the backside redistribution layer 132. The number of openings 181 formed in the second passivation layer 180 may be several tens to several thousands. A material of the second passivation layer 180 is not particularly limited. For example, an insulating material may be used as the material of the second passivation layer 180. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, ABF, FR-4, BT, or the like. Alternatively, a solder resist may also be used.

Meanwhile, although not illustrated in the drawings, a metal thin film may be formed on the walls of the through-hole 110H, if necessary, in order to dissipate heat or block electromagnetic waves. In addition, a plurality of semiconductor chips 120 performing functions that are the same as or different from each other may be disposed in the through-hole 110H, if necessary. Alternatively, the number of through-holes 110H may be plural, and the same or different semiconductor chips 120 may be disposed in the plurality of through-holes 110H.

Figure 11:
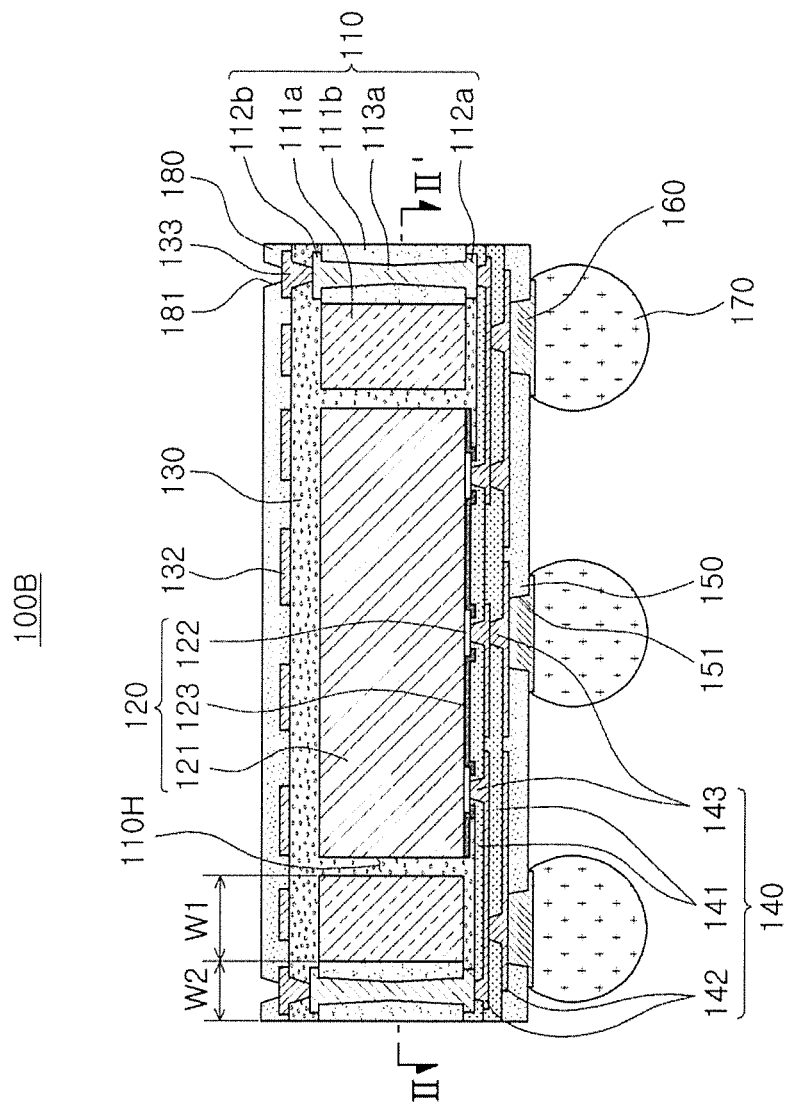
FIG. 11 is a schematic cross-sectional view illustrating another example of a fan-out semiconductor package.

FIG. 11 is a schematic cross-sectional view illustrating another example of a fan-out semiconductor package.

Figure 12:
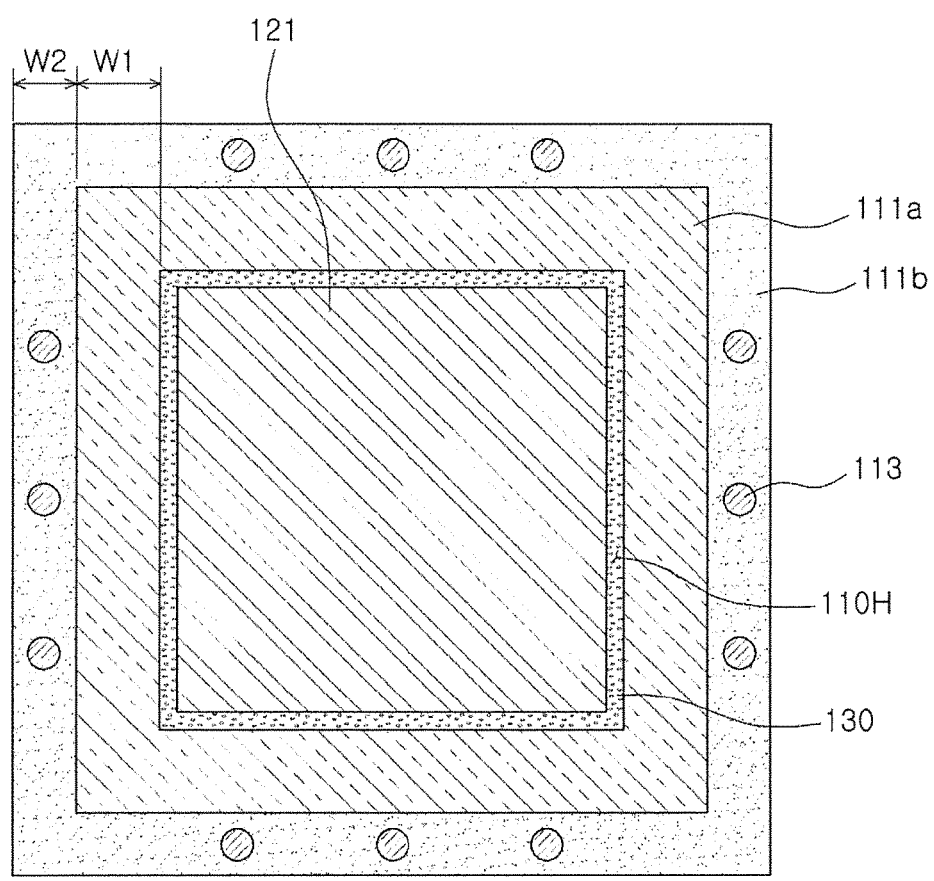
FIG. 12 is a schematic plan view taken along line II-II' of the fan-out semiconductor package of FIG. 11.

FIG. 12 is a schematic plan view taken along line II-II' of the fan-out semiconductor package of FIG. 11.

Referring to the drawings, a support member 110 of a fan-out semiconductor package 100B according to another exemplary embodiment in the present disclosure may have a form different from that of the fan-out semiconductor package 100A according to the exemplary embodiment. In detail, in the fan-out semiconductor package 100B according to another exemplary embodiment, an insulating layer 111b may be disposed to surround outer surfaces of a glass plate 111a, and a through-hole 110H may be formed in only the glass plate 111a. That is, the through-hole 110H may penetrate through only the glass plate 111a of the glass plate 111a and the insulating layer 111b. In this case, the glass plate 111a may not be exposed externally of the fan-out semiconductor package 100B, and all the surfaces of the glass plate 111a may be surrounded by the encapsulant 130, the insulating layer 111b, and the insulating layer 141 of the connection member 140, and a phenomenon in which the glass plate 111a is broken may thus be more effectively prevented. In addition, the glass plate 111a and the insulating layer 111b may be disposed side by side, and the fan-out semiconductor package 100B may thus be further thinned. Meanwhile, a width $W_1$ of the glass plate 111a may be greater than a width $W_2$ of the insulating layer 111b, which may be more effective in maintaining rigidity. In addition, an upper surface and a lower surface of the glass plate 111a may be disposed on levels corresponding to an upper surface and a lower surface of the insulating layer 111b, respectively. In this case, uniformity of a thickness of the encapsulant 130, uniformity of an insulating distance of the connection member 140, or the like, may be promoted. In the fan-out semiconductor package 100B according to another exemplary embodiment, a material of the insulating layer 111b may be prepreg including an insulating resin, a glass fiber, and an inorganic filler, or the like, but is not limited thereto. A predetermined interval may also exist between the glass plate 111a and the insulating layer 111b, if necessary, and may be filled with the encapsulant 130, another separate adhesive, or the like.

In the fan-out semiconductor package 100B according to another exemplary embodiment, redistribution layers and vias may not be formed on and in the glass plate 111a, and redistribution layers 112a and 112b and vias 113 may be formed on and in only the insulating layer 111b. That is, in the fan-out semiconductor package 100B according to another exemplary embodiment, the support member 110 may include the glass plate 111a, the insulating layer 111b, a first redistribution layer 112a disposed on a lower surface of the insulating layer 111b, and a second redistribution layer 112b disposed on an upper surface of the insulating layer 111b. The first and second redistribution layers 112a and 112b may be electrically connected to the connection pads 122. In addition, the support member 110 may include first vias 113 penetrating through the insulating layer 111b and electrically connecting the first and second redistribution layers 112a and 112b to each other. In this case, a defect such as breakage of the glass plate 111a that may occur when the redistribution layers or the vias are formed on or in the glass plate 111a may be significantly reduced. A description of other configurations overlaps that described above, and is thus omitted.

Figure 13:
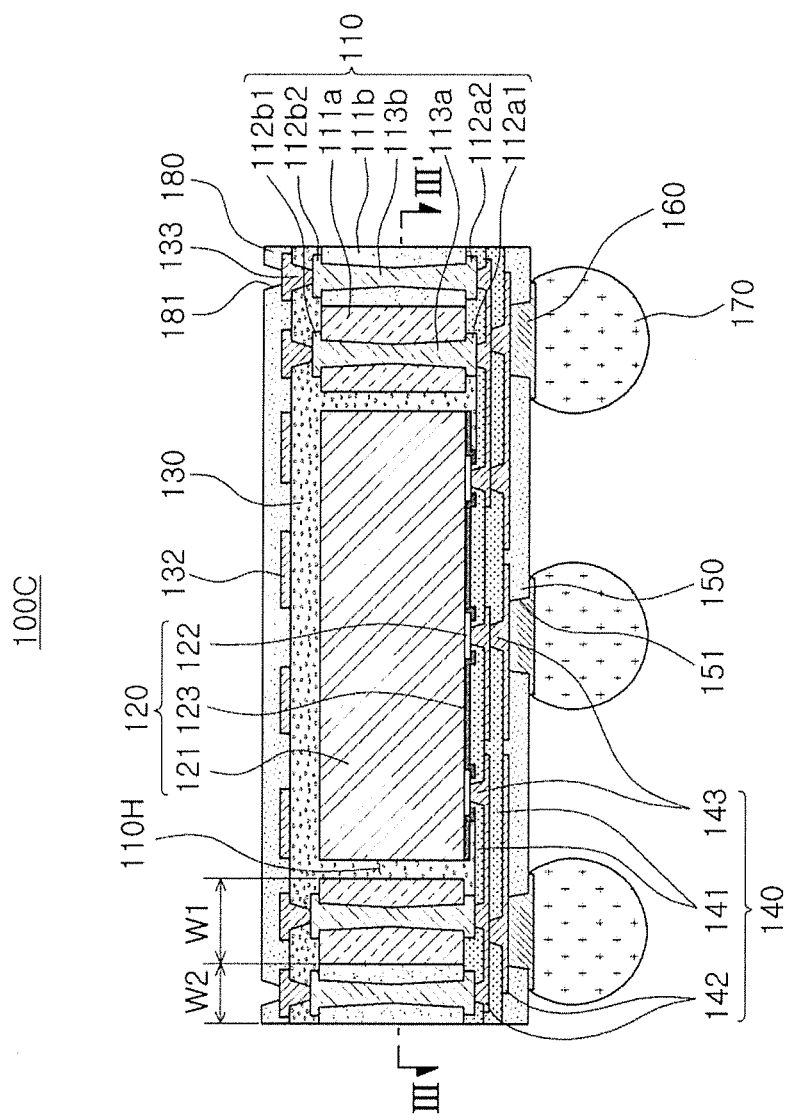
FIG. 13 is a schematic cross-sectional view illustrating another example of a fan-out semiconductor package.

FIG. 13 is a schematic cross-sectional view illustrating another example of a fan-out semiconductor package.

Figure 14:
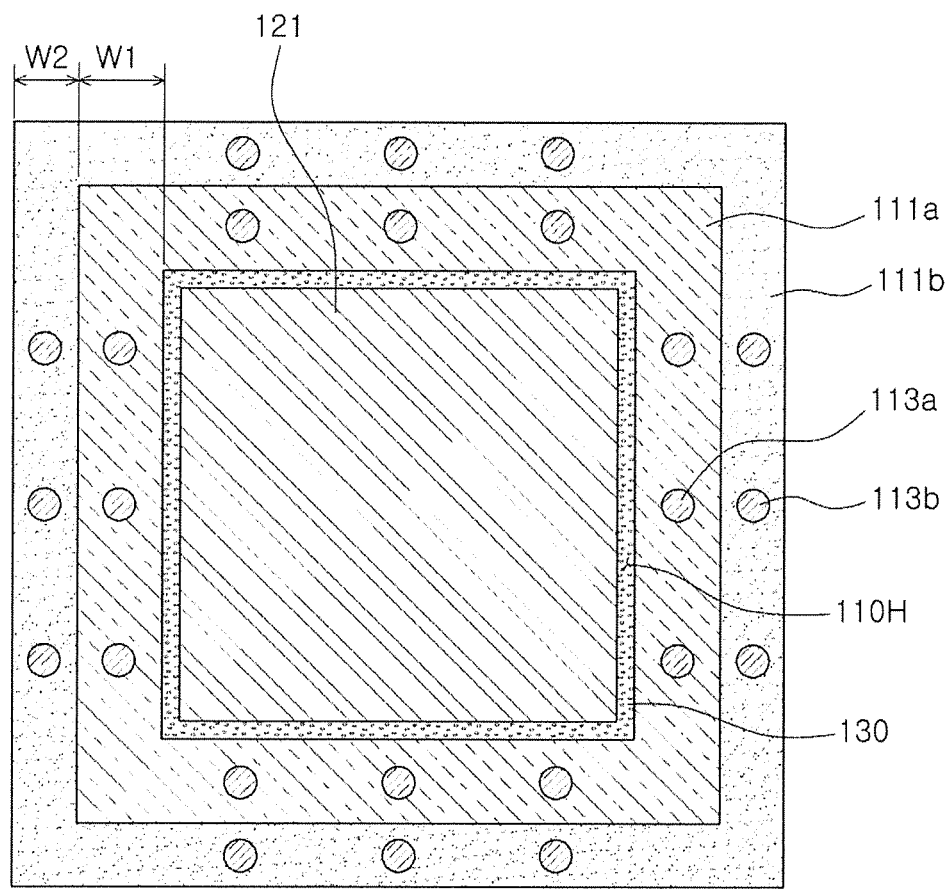
FIG. 14 is a schematic plan view taken along line of the fan-out semiconductor package of FIG. 13.

FIG. 14 is a schematic plan view taken along line of the fan-out semiconductor package of FIG. 13.

Referring to the drawings, a support member 110 of a fan-out semiconductor package 100C according to another exemplary embodiment in the present disclosure may also have a form different from that of the fan-out semiconductor package 100A according to the exemplary embodiment. In detail, the support member 110 of a fan-out semiconductor package 100D may have a form that is substantially similar to that of the fan-out semiconductor package 100B according to another exemplary embodiment described above, but redistribution layers and vias may be formed on and in a glass plate 111a as well as an insulating layer 111b. That is, in the fan-out semiconductor package 100C according to another exemplary embodiment, the support member 110 may include the glass plate 111a, a first redistribution layer 112a1 disposed on a lower surface of the glass plate 111a, a second redistribution layer 112b1 disposed on an upper surface of the glass plate 111a, an insulating layer 111b, a third redistribution layer 112a2 disposed on a lower surface of the insulating layer 111b, and a fourth redistribution layer 112b2 disposed on an upper surface of the insulating layer 111b. The first to fourth redistribution layers 112a1, 112b1, 112a2, and 112b2 may be electrically connected to the connection pads 122. In addition, the support member 110 may include first vias 113a penetrating through the glass plate 111a and electrically connecting the first and second redistribution layers 112a1 and 112b1 to each other and second vias 113b penetrating through the insulating layer 111b and electrically connecting the third and fourth redistribution layers 112a2 and 112b2 to each other. The first and second vias 113a and 113b may be disposed on levels corresponding to each other. A description of other configurations overlaps that described above, and is thus omitted.

Figure 15:
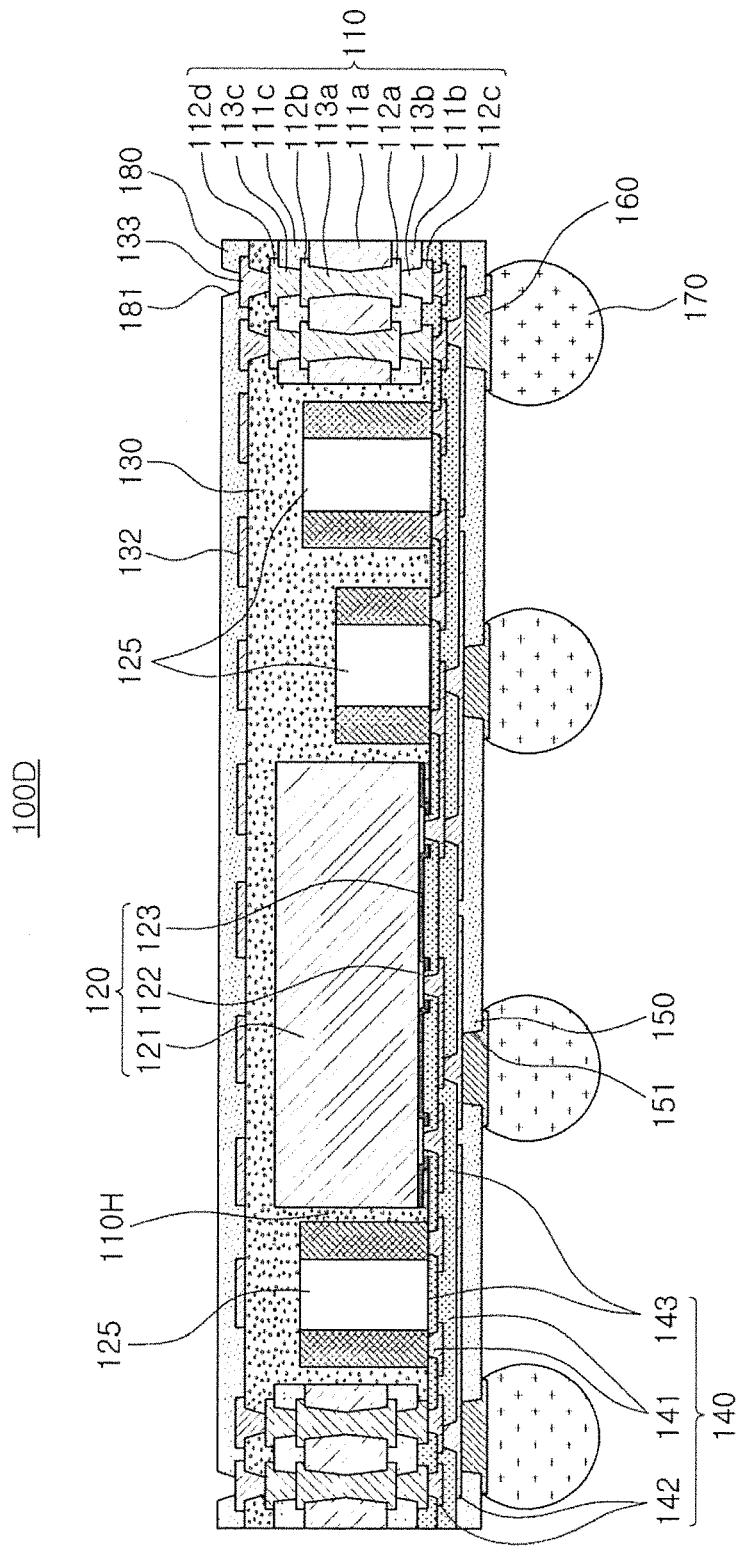
FIG. 15 is a schematic cross-sectional view illustrating another example of a fan-out semiconductor package.

FIG. 15 is a schematic cross-sectional view illustrating another example of a fan-out semiconductor package.

Referring to the drawing, a fan-out semiconductor package 100D according to another exemplary embodiment in the present disclosure may further include passive components 125 disposed side by side with the semiconductor chip 120 in the through-hole 110H, in addition to the components of the fan-out semiconductor package 100A according to the exemplary embodiment. The passive components 125 may be various kinds of passive components. For example, the passive component 125 may be capacitors or inductors. In more detail, the passive components 125 may be multilayer ceramic capacitors (MLCCs), low inductance chip capacitors (LICCs), die side capacitors (DSCs), inductors, integrated passive devices (IPDs), or the like. The passive components 125 may be electrically connected to the connection pads 122 of the semiconductor chip 120 through the connection member 140. Meanwhile, the passive components 125 may be applied to the fan-out semiconductor packages 100B and 100C according to another exemplary embodiment. A description of other configurations overlaps that described above, and is thus omitted.

As set forth above, according to the exemplary embodiments in the present disclosure, the support member may include the glass plate to give excellent rigidity in spite of a reduced thickness, and the support member may include the insulating layer connected to the glass plate together with the glass plate, such that a defect such as breakage of the glass plate may be prevented.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a support member having a through-hole;
a semiconductor chip disposed in the through-hole and having an active surface having connection pads disposed thereon and an inactive surface opposing the active surface;
an encapsulant encapsulating at least portions of the support member and the semiconductor chip; and a connection member disposed on the support member and the active surface of the semiconductor chip and including a redistribution layer electrically connected to the connection pads, wherein the support member includes a glass plate and an insulating layer connected to the glass plate.

2. The fan-out semiconductor package of claim 1, wherein the glass plate is an amorphous solid material including a glass component.

3. The fan-out semiconductor package of claim 1, wherein the insulating layer is formed of an insulating material including an insulating resin and an inorganic filler.

4. The fan-out semiconductor package of claim 1, wherein the support member includes a redistribution layer electrically connected to the connection pads.

5. The fan-out semiconductor package of claim 4, wherein the support member further includes vias penetrating through at least one of the glass plate and the insulating layer and electrically connected to the redistribution layer.

6. The fan-out semiconductor package of claim 1, wherein the insulating layer is disposed on the glass plate, and the through-hole penetrates through the glass plate and the insulating layer.

7. The fan-out semiconductor package of claim 6, wherein the insulating layer includes a first insulating layer disposed on a lower surface of the glass plate and a second insulating layer disposed on an upper surface of the glass plate, and the glass plate has a thickness greater than that of each of the first and second insulating layers.

8. The fan-out semiconductor package of claim 7, wherein the support member includes the glass plate, a first redistribution layer disposed on the lower surface of the glass plate, a second redistribution layer disposed on the upper surface of the glass plate, the first insulating layer disposed on the lower surface of the glass plate and covering the first redistribution layer, a third redistribution layer disposed on a lower surface of the first insulating layer, a second insulating layer disposed on the upper surface of the glass plate and covering the second redistribution layer, and a fourth redistribution layer disposed on an upper surface of the second insulating layer, and the first to fourth redistribution layers are electrically connected to the connection pads.

9. The fan-out semiconductor package of claim 8, wherein the support member includes first vias penetrating through the glass plate and electrically connecting the first and second redistribution layers to each other, second vias penetrating through the first insulating layer and electrically connecting the first and third redistribution layers to each other, and third vias penetrating through the second insulating layer and electrically connecting the second and fourth redistribution layers to each other, and the first to third vias have different cross-sectional shapes.

10. The fan-out semiconductor package of claim 1, wherein the insulating layer is disposed to surround outer surfaces of the glass plate, and the through-hole is formed in the glass plate.

11. The fan-out semiconductor package of claim 10, wherein the glass plate is not exposed externally of the fan-out semiconductor package.

12. The fan-out semiconductor package of claim 10, wherein the glass plate has a width greater than that of the insulating layer.

13. The fan-out semiconductor package of claim 10, wherein the support member includes the glass plate, the insulating layer, a first redistribution layer disposed on a lower surface of the insulating layer, and a second redistribution layer disposed on an upper surface of the insulating layer, the first and second redistribution layers are electrically connected to the connection pads, and the glass plate is not in direct contact with any redistribution layers.

14. The fan-out semiconductor package of claim 13, wherein the support member further includes first vias penetrating through the insulating layer and electrically connecting the first and second redistribution layers to each other, and no vias are formed in the glass plate.

15. The fan-out semiconductor package of claim 10, wherein the support member includes the glass plate, a first redistribution layer disposed on a lower surface of the glass plate, a second redistribution layer disposed on an upper surface of the glass plate, the insulating layer, a third redistribution layer disposed on a lower surface of the insulating layer, and a fourth redistribution layer disposed on an upper surface of the insulating layer, and the first to fourth redistribution layers are electrically connected to the connection pads.

16. The fan-out semiconductor package of claim 15, wherein the support member further includes first vias penetrating through the glass plate and electrically connecting the first and second redistribution layers to each other and second vias penetrating through the insulating layer and electrically connecting the third and fourth redistribution layers to each other, and the first and second vias are disposed on levels corresponding to each other.

17. The fan-out semiconductor package of claim 1, further comprising a passive component disposed side by side with the semiconductor chip in the through-hole.

* * * * *